United States Patent
Allgaier et al.

(10) Patent No.: US 9,537,182 B2
(45) Date of Patent: Jan. 3, 2017

(54) PROCESS AND DEVICE FOR ENSURING OPERATIONAL READINESS OF BATTERIES

(71) Applicant: VEGA GRIESHABER KG, Wolfach (DE)

(72) Inventors: Volker Allgaier, Haslach (DE); Andreas Isenmann, Haslach (DE)

(73) Assignee: Vega Grieshaber KG, Wolfach (DE)

(*) Notice: Subject to any disclaimer, the term of this patent is extended or adjusted under 35 U.S.C. 154(b) by 303 days.

(21) Appl. No.: 14/272,925

(22) Filed: May 8, 2014

(65) Prior Publication Data
US 2014/0338181 A1   Nov. 20, 2014

(30) Foreign Application Priority Data
May 17, 2013 (EP) .................... 13168337

(51) Int. Cl.
*G01N 27/416* (2006.01)
*H01M 10/44* (2006.01)
*G01R 31/36* (2006.01)
*H01M 10/42* (2006.01)
*H01M 10/48* (2006.01)
*H01M 10/46* (2006.01)
*G01R 19/165* (2006.01)

(52) U.S. Cl.
CPC ........ *H01M 10/448* (2013.01); *G01R 31/3627* (2013.01); *G01R 31/3679* (2013.01); *H01M 10/4285* (2013.01); *H01M 10/44* (2013.01); *H01M 10/446* (2013.01); *H01M 10/46* (2013.01); *H01M 10/48* (2013.01); *G01R 19/16542* (2013.01); *Y10T 29/49004* (2015.01)

(58) Field of Classification Search
CPC ............ G01R 31/3648; G01R 31/3624; G01R 31/3675; G01R 31/3651; Y02E 60/12
USPC ........................................... 324/427
See application file for complete search history.

(56) References Cited

U.S. PATENT DOCUMENTS

| | | | |
|---|---|---|---|
| 4,839,248 A | 6/1989 | Magnussen et al. | |
| 6,771,044 B1* | 8/2004 | Vinciguerra | H02J 9/061 320/116 |
| 2006/0017581 A1* | 1/2006 | Schwendinger | G01R 31/3689 340/636.1 |
| 2006/0126249 A1* | 6/2006 | Boling | H02J 7/0031 361/103 |
| 2012/0166847 A1* | 6/2012 | Noda | H01M 10/482 713/323 |
| 2012/0280830 A1 | 11/2012 | Heath | |

FOREIGN PATENT DOCUMENTS

| | | |
|---|---|---|
| EP | 0 891 000 A2 | 7/1998 |
| EP | 2 573 579 A2 | 7/2012 |
| WO | WO 2007/048366 A1 | 10/2005 |

OTHER PUBLICATIONS

EPO Search Report dated Jul. 25, 2013.

* cited by examiner

*Primary Examiner* — Arun Williams
(74) *Attorney, Agent, or Firm* — Juneau & Mitchell

(57) ABSTRACT

The invention claims a process and device for ensuring the operational readiness of a battery in which the battery is first electrically connected with a testing device, and is then tested with the testing device to determine whether the battery is passivated. If the battery is passivated, a procedure for de-passivation of the battery is performed. If the battery is not passivated, a point in time for the next testing of the battery is scheduled.

14 Claims, 2 Drawing Sheets

PROCESS AND DEVICE FOR ENSURING OPERATIONAL READINESS OF BATTERIES

STATEMENT REGARDING FEDERALLY SPONSORED RESEARCH OR DEVELOPMENT

No federal government funds were used in researching or developing this invention.

CROSS REFERENCE TO RELATED APPLICATIONS

This patent application claims priority European Patent Application 13 168 337.7, filed on May 17, 2013.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The present invention relates to a process and device for ensuring operational readiness of batteries, a process for testing the operational readiness of a multitude of batteries, and a device for performing the procedure for ensuring the operational readiness of at least one battery. Further, the present invention relates to a field device, with at least one battery that feeds the field device with energy, which has a device for performing a procedure for ensuring the operational readiness of at least that one battery.

Background of the Invention

The current state of knowledge is as follows.

Standard market batteries or chemical primary cells are now capable of safely feeding field devices even under ambient industrial conditions over several years. Due to their long life and partly very high energy density, lithium based batteries are of special interest. In the consumer sector for instance, one finds lithium-polycarbon-monofluoride (Li/CFX) cells and lithium-manganese oxide (LiMnO$_2$) cells, which are used particularly in cameras, clocks and pocket calculators. In the industrial and medical sectors, lithium iodide (LiJ$_2$) or lithium thionyl chloride (Li/SOCl$_2$) batteries are often used.

Lithium thionyl chloride cells, with a voltage of between 3 and 3.9 volts, have the highest energy density and the highest voltage among all commercially available lithium battery types and have a life of 15 to 25 years. These cells are ideal for applications that require either a very low continuous current over a long period of time and/or a medium to high pulsed current. Due to their long life, these are ideally suited for application in products that have to be always ready for use at any time over a long period of time.

Lithium thionyl chloride cells are available in two forms that differ from each other in their mechanical construction. The bobbin type has the lithium portion integrated with a small surface area. In spiral type cells, the lithium is wrapped in the form of a thin foil and offers a distinctly larger surface area. This leads to two electrical differences. Bobbin type cells have a larger nominal capacity but a smaller nominal current than spiral type cells. Bobbin type lithium thionyl chloride cells are particularly suited for low current applications due to their high energy density, a very low self-discharging rate and a life of 15 to 20 years. Bobbin type lithium thionyl chloride cells can supply energy in a temperature range of −55° C. and +125° C. A high capacity, small size, and a substantial independence from pressure and temperature variations enable a versatile use of these cells.

Spiral type cells distinguish themselves by the fact that they can very quickly provide high pulsating currents of up to several amperes for a duration of seconds to 20 minutes.

A disadvantage of lithium batteries is that, during longer storage, they can build up what is known as an internal passivation layer around the anode or the cathode, which leads to a voltage break down when the battery is under load, since not enough free anode or cathode surface is available to provide a sufficiently high current at nominal voltage. Lithium thionyl chloride batteries, for example, build up an internal oxide layer during storage. This is the case particularly in spiral type cells. Due to this effect, the current load capacity of the batteries is minimized.

When a load is put on the battery, this passivation layer must first be broken down, which can lead to a drop in the battery voltage before the battery voltage stabilizes itself. In case of unfavorable storage conditions (e.g. temperatures of over 20° C. for a long period), the passivation layer can be built up to such an extent that the battery initially does not deliver sufficient energy upon switching on the field device. This manifests itself in the fact that the supply voltage distinctly breaks down. The passivation layer in the cell breaks down and the supply voltage returns to its original value only after a certain load with a certain minimum current.

The initial break down of the supply voltage can result in the fact that a field device does not function any more even though there is sufficient energy available in the battery.

The objective of the invention therefore is to provide a procedure with which the passivation of a lithium battery, particularly a lithium thionyl chloride battery of the spiral type, can be reliably detected in good time and eliminated without unnecessary consumption of too much of the energy available in the battery, so as to be able to ensure instant operability of the battery even after long storage. This problem is solved by a process as described and claimed herein.

BRIEF SUMMARY OF THE INVENTION

In a preferred embodiment,

In a preferred embodiment, a process for securing the operational readiness of a battery, characterized in that,
the battery is electrically connected with a testing device,
the testing unit is used for testing whether the battery is passivated,
c1) if the battery is passivated, a procedure for de-passivation of the battery is performed,
c2) if the battery is not passivated, a point of time for the next testing of the battery is scheduled, and
d2) step a or b is performed again as soon as the point of time is reached.

In another preferred embodiment, the process as described herein, wherein, if step c1 is performed, d1) it is tested whether the battery is de-passivated.

In another preferred embodiment, the process as described herein, wherein the condition of the battery is recorded in an electronically writable storage element after either step b or after step d1 or after step d2.

In another preferred embodiment, the process as described herein, wherein the storage element does not require any current supply for the data storage, and the storage element taken from the group including but not limited to: EPROM, EEPROM, FRAM or an RFID-tag.

In another preferred embodiment, the process as described herein, wherein the battery has a storage element.

In another preferred embodiment, the process as described herein, wherein step b includes the following procedural steps:

drawing of a first current $I_{B1}$ from the battery during the first duration $T_{B1}$, determination of a first minimum voltage $U_{min1}$ from the voltage tapped at the battery during the first duration $T_{B1}$, comparing the first minimum voltage $U_{min1}$ with a prescribed positive first reference value $U_{ref1}$, and providing a first control signal for starting the procedure for de-passivation of the battery if the value of $U_{min1}$ is less than $U_{ref1}$.

In another preferred embodiment, the process as described herein, wherein, if the value of the first minimum voltage $U_{min1}$ is greater that the first reference value $U_{ref1}$, the condition of the battery with a first marking is recorded in the storage element, whereby preferably also the point of time for the next test and/or the point of time of the first marking is recorded.

In another preferred embodiment, the process as described herein, wherein step c1 provides that a second current $I_{B2}$ is drawn from the battery during a second duration $T_{B2}$.

In another preferred embodiment, the process as described herein, wherein step d1 provides the following procedural steps:

drawing of a third current $I_{B3}$ from the battery during a third duration $T_{B3}$, redetermination of a minimum voltage $U_{min2}$ from the voltage tapped at the battery during the third duration, comparing the redetermined minimum voltage $U_{min2}$ with a predetermined reference value $U_{ref2}$ and, providing a second control signal if the value of $U_{min2}$ is equal to or greater than that of $U_{ref2}$.

In another preferred embodiment, the process as described herein, further comprising wherein, if the value of $U_{min2}$ is equal to or greater than $U_{ref2}$, the condition of the battery is recorded with a second marking in the storage element, whereby optionally a second point of time with the date corresponding to the second marking is recorded, preferably in the storage element.

In another preferred embodiment, the process as described herein, further comprising wherein, if the value of $U_{min2}$ is less than that of $U_{ref2}$, the condition of the battery with a third marking is recorded in the storage element, whereby a third control signal is provided, which preferably triggers the marking of the battery with the third marking.

In another preferred embodiment, the process as described herein, wherein the second current strength $I_{B2}$ is less than the first current strength $I_{B1}$, whereby $I_{B1}$ preferably is at least ten times greater than $I_{B2}$.

In another preferred embodiment, the process as described herein, wherein the first control signal activates a first acoustic and/or optical signal which indicates that the battery is passivated.

In another preferred embodiment, the process as described herein, wherein the second control signal activates a second acoustic and/or optical signal which indicates that the battery is de-passivated.

In another preferred embodiment, the process as described herein, wherein the third control signal activates a third acoustic and/or optical signal which indicates that the battery is unserviceable.

A process for testing the operational readiness of a multitude of batteries, including the following steps:
A) Selecting a battery,
B) Checking whether the battery has been marked as unserviceable,
C) Discarding the battery if the battery has been marked as unserviceable, otherwise performing the process of Claim 1,
D) Selecting the next battery if a next battery is selectable and continuing the procedure with step B, otherwise with step E,
E) Scheduling a point in time for the start of the next test of the batteries and continuing the procedure with step A as soon as the point in time is reached.

In another preferred embodiment, a device for performing one or more of the processes described herein, comprising a terminal for connecting of at least one battery, a testing device connected to the terminal for the detection of a passivation of the battery, as well a device unit connected to the testing device and the terminal for the de-passivation of the battery.

In another preferred embodiment, a field device with at least one battery feeding the field device with energy, wherein at least one battery is connected to the device for performing the described process, as described immediately above, whereby that device has a timer with which the process can be performed in prescribed time intervals.

In another preferred embodiment, a method of use of one of the processes as described herein, further comprising a field device that has at least one battery for ensuring operational readiness of the field device supplied by at least that one battery.

DETAILED DESCRIPTION OF THE INVENTION

Figure 1:
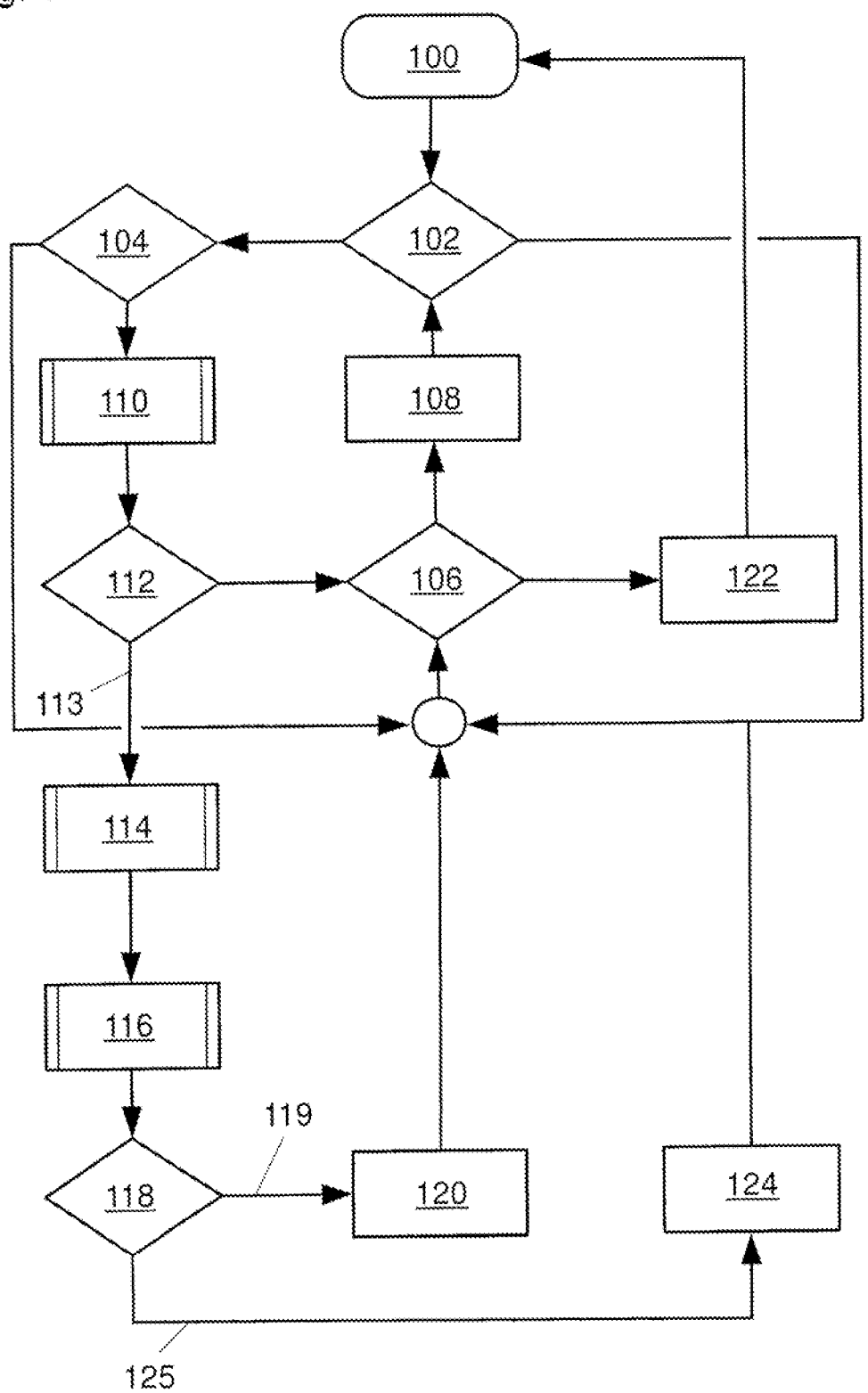
FIG. 1 is a flow chart evidencing an example of a typical procedural sequence for a test and if necessary a depassivation of a battery or a multitude of batteries.

As long as not otherwise stated, the steps disclosed in this document are to be performed one after the other.

To be able to establish the operational readiness of a battery, the innovative procedure initially envisages that the battery is electrically connected to the testing device and is subsequently checked by the testing device as to whether the battery is passivated or not. This can take place, for example, in such a way, that current of a particular magnitude is drawn from the battery for a definite period of time, and the voltage that can be tapped at the battery is observed. If it turns out during this test that the battery is passivated, a procedure for depassivating the battery is performed. Such a depassivation can, for instance, be achieved by putting an electrical load on the battery for a certain duration. If it turns out that the battery is not passivated, then a time for the next check of the battery is scheduled. As soon as this is reached, the battery is checked again. This means that as soon as this point of time is reached, the battery is either again electrically connected to the testing device, or, if it is still connected to the testing device, it is tested whether or not it is passivated at this point of time.

An advantage of this procedure is that a depassivation of the battery takes place only if the battery was passivated before. Thus, an unnecessary depletion of energy available in the battery is avoided. On the other hand, this procedure ensures that the battery is operational at all times, even after longer intervals. The time between two battery checks can be many days, weeks, months or years in this process. Thus, one can schedule whether the battery is checked in weekly, monthly, quarterly or half-yearly intervals or even in yearly intervals. On the other hand, the interval between two checks can be determined by measuring the voltage on the battery during current drain and the time for the next check is scheduled depending on the measured or calculated value of the voltage.

If it was ascertained that the battery was passivated, and a procedure for depassivation of the battery has already been performed, one can check again or resolve in a preferred embodiment whether the battery is now depassivated or whether the depassivation of the battery was not successful.

If it turns out after performing the procedure for depassivation that the battery is now depassivated, the condition of the battery can, for instance, be stored in an electronically recordable storage element. This way, it can be determined at a later date whether the depassivation procedure, which depleted the battery of a certain amount of energy, has been performed or not. With that one can assess the amount of residual capacity still available in the battery.

On the other hand, if, after the depassivation of the battery, it turns out that the voltage of the battery does not reach a predetermined reference value, one can conclude that the battery is unserviceable. This battery condition can also be recorded, for example, in an electronically recordable storage element, so that it can be determined even at a later date that the battery is unserviceable and must be discarded.

If, during the check of the battery with the test device, it was found that the battery was not depassivated, this condition can also be recorded in an electronically recordable storage element. One can then immediately recognize that no depassivation needed to be performed and that the battery has not lost any energy due to a depassivation procedure.

The electronically recordable storage element preferably should not require any current supply for data retention. This way, the stored information remains in the storage element independent of the condition of the battery. Since no energy is required for data retention, no battery energy must be used for retention of this information. The storage element is preferably taken from the group including, but not limited to, EPROM, an EEPROM, an FRAM or an RFID-tag.

In a preferred embodiment, the battery itself has an electronically recordable storage element. This way, simply by reading the electronically recordable storage element, one can immediately determine whether, and to what extent, the battery is operational.

The procedure for ensuring the operational readiness of a battery for the testing of the battery with a device in a preferred embodiment requires that the following steps be performed:

To start, for the first duration, a first current is drawn from the battery. During this drawing, a first minimum voltage from the voltage tapped at the battery during the initial instance is determined. After this first minimum voltage is determined, it is compared with a first predetermined positive first reference value and a first control signal is provided for starting of the procedure for depassivation of the battery, if the value of the first minimum voltage is less than the first reference value.

If the value of the first minimum voltage is greater that the first reference value, the condition of the battery can, for instance, be recorded in a storage element with a first marking, whereby preferably also the point of time for the next check and/or the point of time of the first marking is recorded.

The battery is advantageously provided with a first marking only if the check of the battery has revealed that the battery is ok without a depassivation needing to be performed. Particularly advantageous is when a first marking already recorded in the storage element is overwritten or deleted if a depassivation has to be/had to be performed to make the battery operational again.

If, during the test, it turns out that the battery voltage is too low and/or that the battery is passivated, an advantageous procedure for the depassivation of the battery ensures that a second current is drawn from the battery for a second period of time.

Advantageously, a retest of the battery follows the procedure for depassivation of the battery, with which one can determine whether the battery is operational after the depassivation. For this purpose, a third current is drawn from the battery during a third period of time and a second minimum voltage that is tapped at the battery during the third period of time is determined. Then the predetermined minimum voltage, i.e. the second minimum voltage, is compared with a predetermined second positive reference value and, if the value of the second minimum voltage is equal to or greater than the second reference value, a second control signal is provided.

In doing so, the condition of the battery with a second marking in a storage element is advantageously recorded, whereby, as a preferred option, a date corresponding to the point of time of the second marking is recorded. If a battery shows a second marking, it indicates that the battery has already been depassivated and is now operational.

If several battery checks have taken place, a first marking of the battery which possibly still exists can be overwritten or deleted, particularly then if a depassivation was required.

Advantageously, every time a battery has been depassivated, a second marking is recorded in the storage element, so that from the number of second markings one can arrive at the amount of charge still remaining in the battery. Since a certain amount of charge is withdrawn from the battery during each depassivation, one can arrive at the amount of charge remaining in the battery from the number of depassivations.

After a depassivation, if it turns out that the value of the re-determined minimum voltage $U_{min2}$ is less than the pre-determined positive second reference value $U_{ref2}$, one can conclude that the depassivation was no longer successful. In this case, the condition of the battery with a third marking is recorded in the storage element, whereby a third control signal, which preferably triggers the marking of the battery with the third marking, is preferably provided. In such a case the battery should be discarded as it is has become unserviceable.

For the depassivation of the battery, the second current strength can be greater than the first current strength, whereby the second current strength is preferably at least ten times as high as $I_{B1}$. To achieve an immediate depassivation of the battery, the battery can, for instance, actually be short circuited for a very short time of advantageously between 100 ms and three to five seconds. The depassivation can naturally also take place over a considerably longer time, a lower depassivation current should however be selected so as not to draw more charge from the battery as is necessary for depassivation.

Depending on the size of the battery, the current for depassivation can be adjusted in such a way that it lies between 0.1 and 10 mA per cm$^2$ of anode surface area, preferably between 0.5 and 3 mA per cm$^2$ of anode surface area. If a longer depassivation time of, for instance, several minutes to several hours is acceptable, a lower charging current can be selected. Thus, a depassivation current of between 5 and 50 mA for a period of between five minutes and two hours can lead to a depassivation of the battery.

To indicate whether a battery is ok, is passivated or is unserviceable, a first, second or third control signal can activate a corresponding acoustic and/or optical signal with which this condition can be notified:

The first control signal can, for instance, activate a first acoustic and/or first optical signal which notifies that the battery is passivated.

The second control signal can, for instance, activate a second acoustic and/or second optical signal which notifies that the battery is depassivated.

The third control signal can, for instance, activate a third acoustic and/or third optical signal which notifies that the battery is unserviceable.

If, for instance, it is found during the first testing that the battery is not passivated, a fourth acoustic and/or a fourth optical signal can notify that the battery is ok.

Lithium ion batteries are preferably tested according to the procedure described here. The lithium ion battery being tested is preferably a lithium thionyl chloride battery or a lithium manganese dioxide battery. Even more preferably, the battery type involved is of the spiral type.

A multitude of batteries can also be checked for operational readiness with the procedure described. For this, firstly one battery is selected and checked whether the battery is marked unserviceable. If it is marked unserviceable, it is discarded. Otherwise a procedure for ensuring the functional readiness of a battery of the type already described can be performed. The battery is checked, as is described further down. When the testing and the depassivation, if required, is finished, the next battery is selected in so far as another battery is selectable. If another battery could be selected, it is again checked whether the battery now selected is marked as unserviceable. If no battery could be selected next, a point of time is scheduled for the start of the next check of batteries and as soon as this point of time is reached, the procedure for testing the operational readiness of a multitude of batteries is performed again.

The duration between two checks for operational readiness of a multitude of batteries lies advantageously between three months and about five years. The duration is preferably selected depending on the load on the batteries during use in a device. For batteries that are continuously under use, a longer duration can be chosen; for batteries that are only used seldom and over short durations, but which must always be ready to use, a shorter duration should be chosen.

The procedure described for ensuring the operational readiness of a battery, or the procedure for testing the operational readiness of a multitude of batteries, can therefore be performed preferably with an appropriate device which has a terminal for connecting at least one battery, as well as a testing device connected to the terminal for the detection of a passivation of the battery, as well as a device unit connected to the test device and the terminal for the depassivation of the battery or of a multitude of batteries.

It particularly advantageous if such a device in housed in a field device which has at least one battery that can supply the field device with energy, whereby at least that one battery is connected to the device for performing the procedure for ensuring the operational readiness of a battery or a multitude of batteries, and whereby the device preferably has a timer with which such a procedure can be performed at prescribed intervals. Thus, in field devices that are seldom activated or need to be activated, and which are equipped with at least one battery that supplies the field device with energy, it can be ensured that the field device is ready for use anytime. If a field device is not in use for a long time, and no current is drawn from the battery, or from the battery that feeds the field device, for a long time, due to the fact that a check of the battery voltage under load takes place in prescribed time intervals, and if necessary a depassivation is immediately triggered, it ensures that the battery or the multitude of batteries is or are always ready for use at all times. The use of a procedure of the type described in a field device having at least one battery can therefore ensure the operational readiness of a field device fed with at least that one battery.

The terms "above," "below," "left" and "right" and other similar terms used in the subsequent description relate to the embodiment examples and should in no way be restricting, even when they relate to preferred embodiments.

DETAILED DESCRIPTION OF THE FIGURES

FIG. 1 shows a procedure for ensuring the operational readiness of one or more batteries. The procedure is started, for instance, on starting block 100 by checking whether a battery is available in a first comparator 102. If a battery is available, a check is performed in a second comparator 104 as to whether the battery is marked as unserviceable. If the battery is marked as unserviceable, it can be discarded.

In the next step, in case the batteries have been marked as unserviceable, it is checked in a third comparator 106 as to whether another battery is available for testing. If this is the case, it switches over to the next switchover block 108 to the next battery to be tested.

If it is found that there is no battery available for testing in the first comparator 102, the third comparator 106 is likewise checked as to whether another battery, which is possibly being held in another battery holder, is available for testing. If this is the case, it switches over to the next battery in the switchover block 108 and this is then tested.

If the check in the second comparator 104 shows that the battery is not marked as unserviceable, it is tested in test block 110 whether the battery is depassivated or not. For this, a first current $I_{B1}$ is drawn during a first duration $T_{B1}$ and during which a first minimum voltage $U_{min1}$ on the battery is determined.

Figure 2:
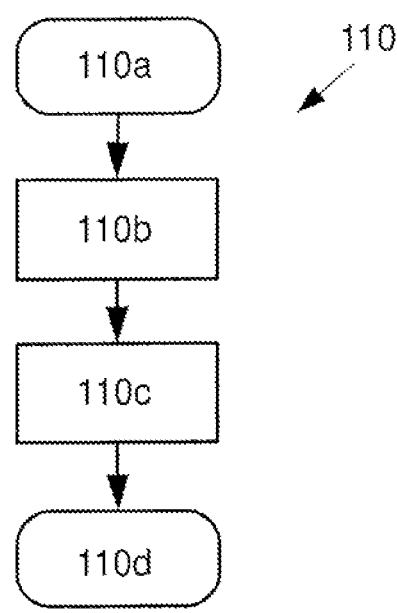
FIG. 2 is a flow chart evidencing a typical example of a battery check process.

This sequence is shown schematically in FIG. 2: The battery test 110 begins in starting block 110a with the loading of the battery with a loading current $I_{B1}$ during a time $T_{B1}$ and a simultaneous monitoring of the voltage in block 110b. A first minimum voltage $U_{min1}$ is determined in block 110c from the voltage tapped during the time $T_{B1}$, recorded in block 110d and read out. The read out value $U_{min1}$ is then, as can be seen if FIG. 1, compared with a first predetermined reference value $U_{ref1}$ in a fourth comparator 112.

If the value of the first minimum voltage $U_{min1}$ is less than the predetermined positive first reference value $U_{ref1}$, a first control signal 113, which starts the procedure for depassivation of the battery in the depassivation block 114, is provided.

Figure 3:
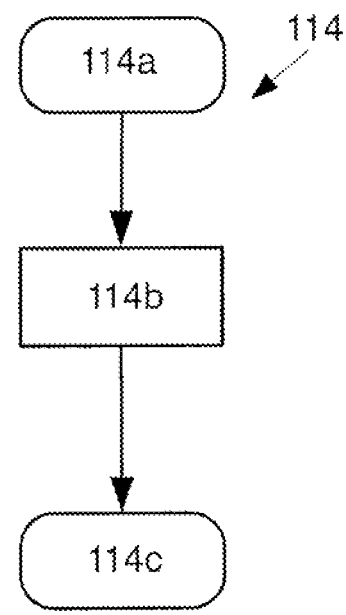
FIG. 3 is a flow chart evidencing a typical example of a battery depassivation process.

FIG. 3 shows schematically the sequence of the depassivation procedure: The procedure is triggered in starting block 114a by the first control signal 113. The depassivation of the battery takes place by drawing a second current $I_{B2}$ from the battery for a second duration $T_{B2}$ in block 114b. When the second duration $T_{B2}$ ends, the end of the depassivation in block 114c is displayed.

If it was found in the fourth comparator that the value of the minimum voltage $U_{ref1}$ is equal to or higher than the first reference value $U_{ref1}$, the battery can be marked with a mark which indicates that the battery is ok. In this case the test of the battery is over and it will be rechecked in the third comparator 106 whether another battery is available for testing.

If a depassivation has to be performed in block 114, it can be checked in test block 116, adjoining the depassivation block 114, whether the passivation was successful or not. For this, a third current $I_{B3}$ is drawn from the battery during a third duration $T_{B3}$, a second minimum voltage $U_{min2}$ determined from voltage tapped from the battery during the third duration $T_{B3}$ and the second minimum value $U_{min2}$ compared with a predetermined positive second reference value $U_{ref2}$ in a fifth comparator 118.

If this check shows that the value of the second minimum voltage $U_{min2}$ is equal to or greater than the predetermined second reference value $U_{ref2}$, a second control signal 119 is provided. The condition of the battery can then be recorded with a second marking in the data storage block 120, whereby preferably in the same data storage block 120 a point of time corresponding to the date of the second marking is recorded.

A battery that has a second marking is a battery that is ready for use after a depassivation procedure.

After the data is recorded in storage block 120, in this case the test of the battery is over and whether another battery is available for testing is checked in the third comparator 106. If this is not the case, the end of the entire battery test is recorded in the timer block 122 and the timer is given a prescribed fixed duration delta t, according to which the timer in block 122 starts the next check procedure. These predetermined durations can amount to many months.

If it was found in the fifth comparator 118, that the value of the redetermined minimum voltage $U_{min2}$ is less than the predetermined positive second reference value $U_{ref2}$, the condition of the battery can be recorded with a third marking in a storage block 124, whereby the third marking of the battery can be triggered by a third control signal 125. In doing so, the storage block 124 can be identical to block 120, but need not be so. In this case the battery is marked as unserviceable in block 124.

Whether another battery is available for testing can subsequently be checked again in the third comparator 106.

Figure 4:
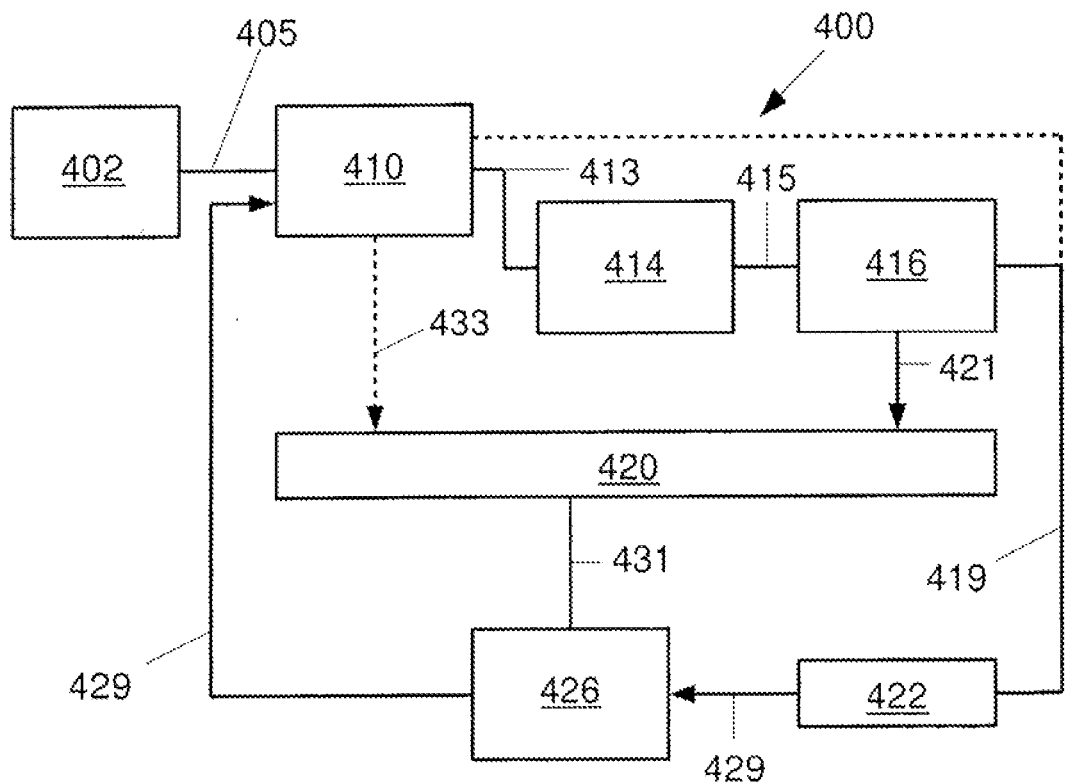
FIG. 4 is a line drawing evidencing a battery testing device for ensuring the operational readiness of a battery.

FIG. 4 shows a battery testing device 400 with a battery holder 402 for holding a battery that is to be tested, which is connected to a testing device 410 through an electrical connection 405 (the corresponding reference mark is missing in FIG. 4!). The testing device 410 can test the battery in the battery holder 402 as to whether the battery is passivated or not.

For this, the testing device 410, in a preferred embodiment of the battery, can draw a first current $I_{B1}$ during a first duration $T_{B1}$ from the voltage tapped at the battery during the first duration $T_{B1}$ and determine a minimum voltage $U_{min1}$ and compare this minimum voltage $U_{min1}$ with a prescribed positive reference value $U_{ref1}$.

If the value of $U_{min1}$ is less than $U_{ref1}$, the testing device 410 can provide the first control signal 113 through the connecting lead 413 for starting the procedure for depassivation of the battery in a device unit 414. For this, the testing device 410 is electrically connected through the connecting lead 413 with the device unit 414, which is a depassivation unit.

If the first control signal 113 is provided through the connecting lead 413, the device unit 414 starts the depassivation of the battery in the battery holder 402. For this purpose, it draws a second current $I_{B2}$ during a second duration $T_{B2}$ from the battery in the battery holder 402. This procedure depassivates the battery.

The device unit 414 is further connected to a test unit 416 through an electrical connecting lead 415. After the depassivation of the battery in the device unit 414 is complete, the test unit 416 checks whether the battery is actually depassivated or not.

In a preferred embodiment, it is provided that the test unit 416 draws a third current $I_{B3}$ during a third duration $T_{B3}$ from the battery in the battery holder 402, in doing so the minimum voltage $U_{min2}$ tapped at the battery during the third duration $T_{B3}$ is redetermined and subsequently the redetermined minimum voltage $U_{min2}$ is compared with a predetermined positive second reference value $U_{ref2}$.

If the value of $U_{min2}$ is equal to or greater than $U_{ref2}$, the second control signal 119 is provided through the connecting lead 419. At the same time, the information that the battery is depassivated is recorded in the storage element 420. For this, the testing unit 416 is electrically connected to storage element 420 through connecting lead 421.

The testing unit 416 is further connected to a timer 422 through the connecting lead 419. If the [second] control signal 119 is now sent to the timer through the connecting lead 419, the battery test is completed. At the end of the battery test a point of time is scheduled in the timer 422 for the next battery test. When this point of time is reached, the timer 422 triggers the testing device 410 by way of a read-out unit 426 through the trigger lead 429 connected to the testing device 410. The read-out unit 426 can read the condition of the batteries in the battery holder 402 recorded in the storage element 420 through a connecting lead 431, which is connected to the storage element 420, and evaluate it for the next test.

If the testing of the battery in the battery holder 402 in the testing device 410 shows that the value of the minimum voltage $U_{min1}$ is greater that the first reference value $U_{ref1}$, this condition of the battery can be recorded with a first marking in the storage element 420 through the connecting lead 433, whereby preferably the point of time for the next testing of the battery and/or the point of time of the first marking is predetermined and/or recorded. In this case, depassivation of the battery should not be performed. The testing of the battery is over. Only a point of time for the timer 422 for the next test of this battery is scheduled and transmitted to the timer 422, as can be seen from the dotted line in FIG. 4.

In an experiment, 16 cells were tested for passivation after a storage time of about one year. Each of the 16 cells was loaded with a resistance of 5.6 ohms and the voltage was measured. In eleven of the 16 cases, the voltage fell below the 3 volts quoted by the manufacturer. These cells showed voltages between 2.80 and 2.98 volts. The other five cells were slightly above the voltage limit with values between 3.01 and 3.04 volts. After loading the cells for one hour, whereby a current of 35 mA was drawn from the cells, only one of the 16 cells measured fell below the voltage limit of 3.0 volts. Thus, the depassivation of the other 10 cells was successful.

LIST OF REFERENCE NUMBERS

100 Starting block
102 First comparator
104 Second comparator
106 Third comparator
108 Switchover block
110 Test block
110a Start battery test
110b Load and voltage monitoring
110c Calculation of $U_{min1}$
110d End of battery test
112 Fourth comparator
113 First control signal
114 Depassivation block
114a Start depassivation
114b Battery loading
114c End of depassivation
116 Testing block
118 Fifth comparator
119 Second control signal
120 Data storage block
122 Timer block
124 Storage block
125 Third control signal
400 Battery testing device
402 Battery holder
405 Connection
410 Testing device
413 Connection
414 Device unit
415 Connection
416 Test unit
419 Connection
420 Storage element
421 Connection
422 Timer
426 Read-out unit
429 Trigger lead
431 Connection
433 Connection The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable Equivalents.

We claim:

1. A process for securing the operational readiness of a battery, wherein, a) the battery is electrically connected with a testing device,
b) a testing unit is used for testing whether the battery is passivated,
c1) if the battery is passivated, a procedure for de-passivation of the battery is performed,
c2) if the battery is not passivated, a point of time for the next testing of the battery is scheduled,
d1) if step c1) is performed, the battery is tested for de-passivation, and
d2) step a or b is performed again as soon as the point of time is reached and, if step c1 is performed, d1) it is tested whether the battery is de-passivated, and
wherein the condition of the battery is recorded in an electronically writable storage element after either step b or after step d1 or after step d2, the storage element does not require any current supply for the data storage, and the storage element taken from the group including but not limited to: EPROM, EEPROM, FRAM or an RFID-tag, and the battery has a storage element, and also whereby the point of time for the next check of the battery is recorded.

2. The process of claim 1, wherein step b includes the following procedural steps:
drawing of a first current $I_{B1}$ from the battery during a first duration $T_{B1}$,
determination of a first minimum voltage $U_{min1}$ from the voltage tapped at the battery during a first duration $T_{B1}$,
comparing the first minimum voltage $U_{min1}$ with a pre-scribed positive first reference value $U_{ref1}$, and
providing a first control signal for starting the procedure for de-passivation of the battery if the value of $U_{min1}$ is less than $U_{ref1}$.

3. The process of claim 2, wherein, if the value of the first minimum voltage $U_{min1}$ is greater that the first reference value $U_{ref1}$, the condition of the battery with a first marking is recorded in the storage element, whereby preferably also the point of time for the next test and/or the point of time of the first marking is recorded.

4. The process of claim 2, wherein the first control signal activates a first acoustic and/or optical signal which indicates that the battery is passivated.

5. The process of claim 1, wherein step c1 provides that a second current $I_{B2}$ is drawn from the battery during a second duration $T_{B2}$.

6. The process of claim 5, wherein the second current strength $I_{B2}$ is less than the first current strength $I_{B1}$, whereby $I_{B1}$ preferably is at least ten times greater than $I_{B2}$.

7. The process of claim 1, wherein step d1 provides the following procedural steps:
drawing of a third current $I_{B3}$ from the battery during a third duration $T_{B3}$,
redetermination of a minimum voltage $U_{min2}$ from the voltage tapped at the battery during the third duration,
comparing the redetermined minimum voltage $U_{min2}$ with a predetermined reference value $U_{ref2}$ and,
providing a second control signal if the value of $U_{min2}$ is equal to or greater than that of $U_{ref2}$.

8. The process of claim 7, further comprising wherein, if the value of $U_{min2}$ is equal to or greater than $U_{ref2}$, the condition of the battery is recorded with a second marking in the storage element, whereby optionally a second point of time with the date corresponding to the second marking is recorded, preferably in the storage element.

9. The process of claim 7, further comprising wherein, if the value of $U_{min2}$ is less than that of $U_{ref2}$, the condition of the battery with a third marking is recorded in the storage element, whereby a third control signal is provided, which preferably triggers the marking of the battery with the third marking.

10. The process of claim 9, wherein the third control signal activates a third acoustic and/or optical signal which indicates that the battery is unserviceable.

11. The process of claim 7, wherein the second control signal activates a second acoustic and/or optical signal which indicates that the battery is de-passivated.

12. A device for performing the process of claim 1, comprising a terminal for connecting of at least one battery, a testing device connected to the terminal for detection of a passivation of the battery, as well a device unit connected to the testing device and the terminal for de-passivation of the battery.

13. A field device comprising at least one battery feeding the field device with energy, wherein at least one battery is connected to the device of claim 12, whereby the field device has a timer with which the process of claim 1 can be performed in prescribed time intervals.

14. (Previously provided) A method of use of the field device of claim 13, wherein such device is used to complete the process of claim 1.

\* \* \* \* \*